(12) United States Patent
Kobayashi et al.

(10) Patent No.: US 6,998,710 B2
(45) Date of Patent: Feb. 14, 2006

(54) HIGH-FREQUENCY DEVICE

(75) Inventors: Kazuhiko Kobayashi, Kawasaki (JP); Fumitaka Kondo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/710,775

(22) Filed: Aug. 2, 2004

(65) Prior Publication Data

US 2005/0139981 A1    Jun. 30, 2005

(30) Foreign Application Priority Data

Dec. 24, 2003 (JP) .............................. 2003-426204

(51) Int. Cl.
*H01L 23/34* (2006.01)
(52) U.S. Cl. ..................... 257/728; 257/678
(58) Field of Classification Search ................ 257/738, 257/723, 698, 693, 686, 690, 678, 728
See application file for complete search history.

(56) References Cited

FOREIGN PATENT DOCUMENTS

| JP | 9-306917 | 11/1997 |
| JP | 10-64953 | 3/1998 |
| JP | 2002-313930 | 10/2002 |
| JP | 2003-243570 | 8/2003 |

*Primary Examiner*—Douglas W Owens
(74) *Attorney, Agent, or Firm*—Armstrong, Kratz, Quintos, Hanson & Brooks, LLP

(57) ABSTRACT

A high-frequency device has a semiconductor substrate; a high-frequency circuit layer formed on the substrate and including a circuit element and a multilayer wiring layer; electrically conductive pads; rewiring layers connected to the electrically conductive pads; an electrically insulating sealing layer formed on the first electrically insulating layer and the rewiring layer and having a thickness larger than the multilayer wiring layer; electrically conductive posts provided inside the electrically insulating sealing layer and between the rewiring layer and the mounting connection terminals. A first electrically conductive post corresponding to a power source has a first diameter; a second electrically conductive post corresponding to an input of input amplifier has a second diameter less than the first diameter; and a third electrically conductive post corresponding to an output of power output amplifier has a third diameter larger than the second diameter.

12 Claims, 12 Drawing Sheets

Receiving Side Post & Transmitting Side Post

Power Source & Ground Posts

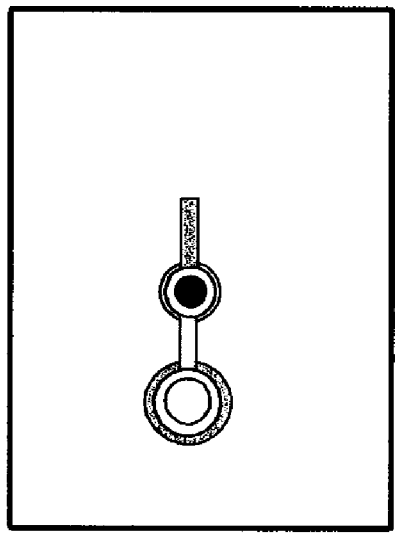
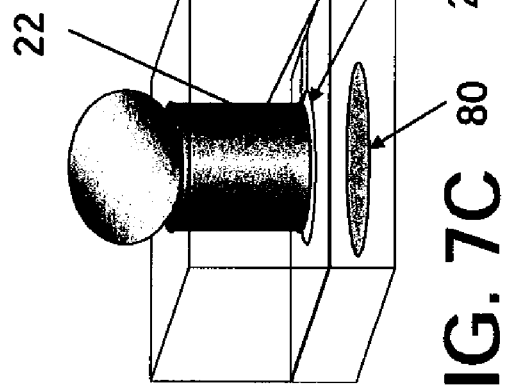
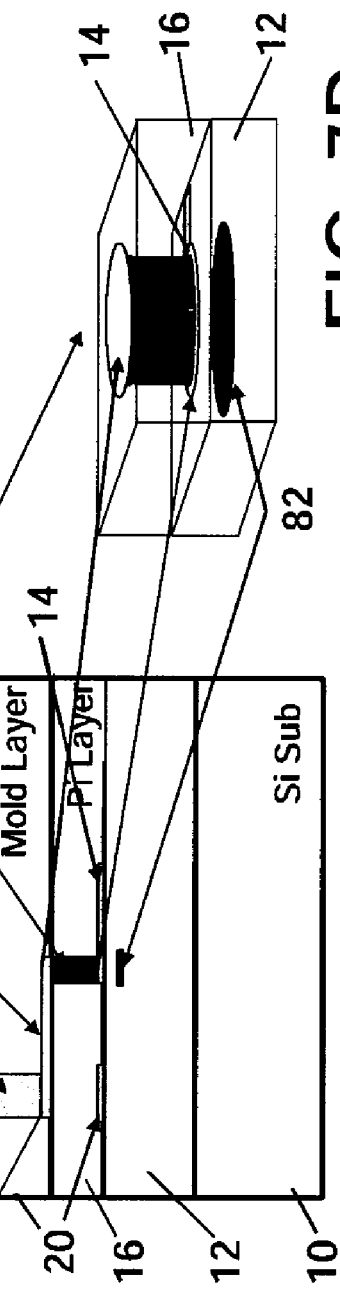
FIG. 7A
FIG. 7B
FIG. 7C
Shield Portion
FIG. 7D
Shiled Portion

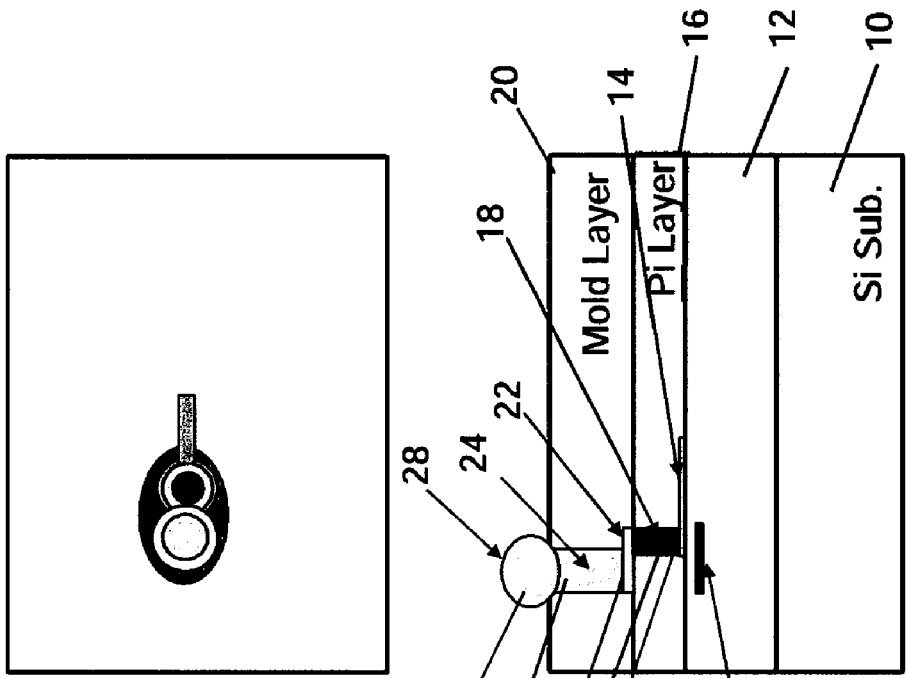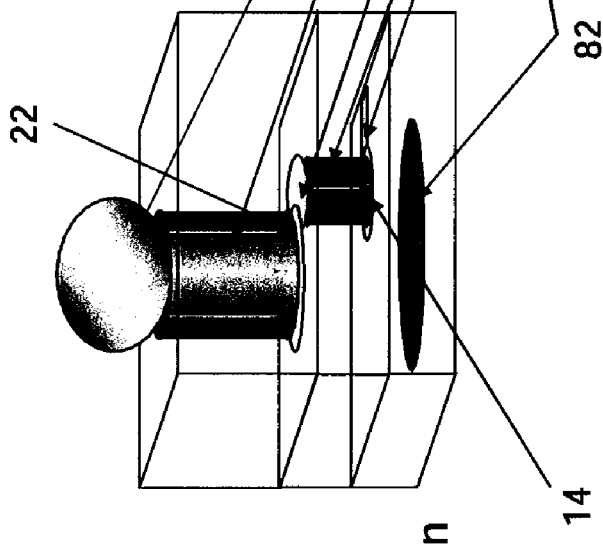
FIG. 8A
FIG. 8B
FIG. 8C
Shield Portion

Relation Between Post Diameter and Loss for 5GHz

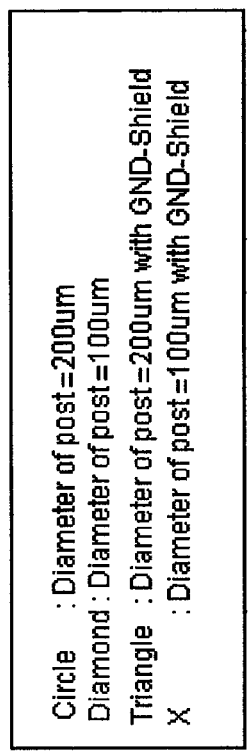
FIG. 11
Circle    : Diameter of post=200um
Square   : Diameter of post=175um
Triangle  : Diameter of post=150um
X          : Diameter of post=125um
Diamond : Diameter of post=100um
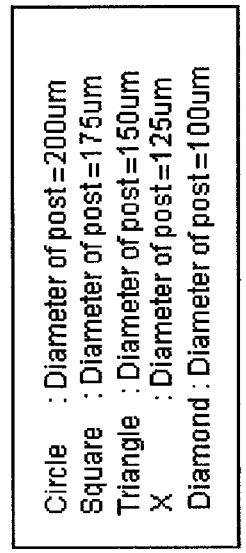
FIG. 12
Circle    : Diameter of post=200um
Diamond : Diameter of post=100um
Triangle  : Diameter of post=200um with GND-Shield
X          : Diameter of post=100um with GND-Shield
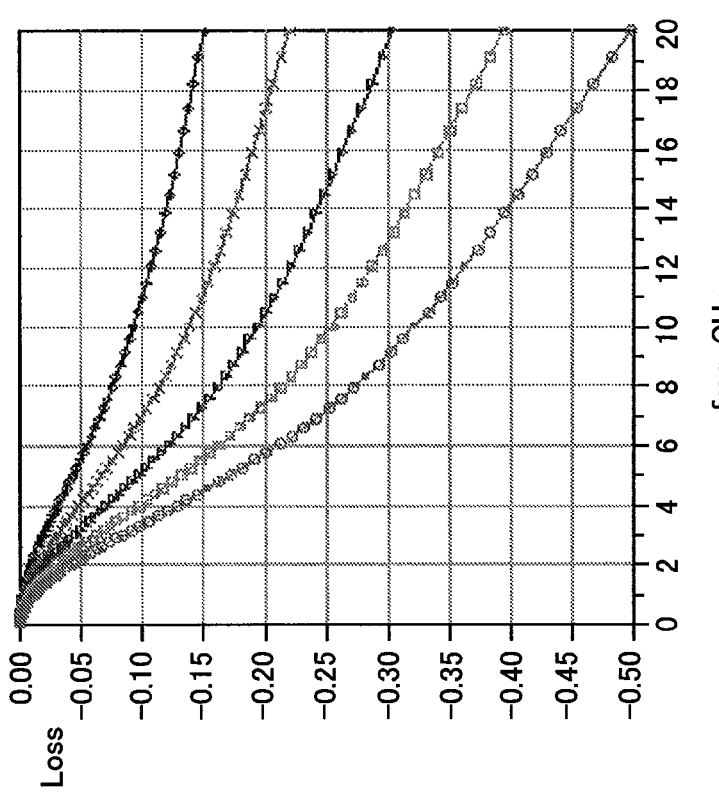

HIGH-FREQUENCY DEVICE

CROSS-REFERENCE TO RELATED APPLICATIONS

This application is based upon and claims the benefit of priority from the prior Japanese Patent Application No. 2003-426204, filed on Dec. 24, 2003, the entire contents of which are incorporated herein by reference.

BACKGROUND OF THE INVENTION

1. Field of the Invention

The present invention relates to a high-frequency device in which a high-frequency circuit is integrated on a semiconductor chip, more particularly to a high-frequency device whose size is decreased by using a chip sized package and high-frequency characteristic is improved.

2. Description of the Related Art

Wide spread of portable communication apparatuses created a demand for low-cost, compact and highly functional devices which are to be mounted thereupon. There are high-frequency devices that use a silicon substrate in order to reduce cost. It was suggested to form high-frequency circuits on a silicon substrate rather than on more expensive gallium-arsenic substrate of the conventional type. Furthermore, a chip sized package or chip scale package (CSP) is used to decrease the size. A chip sized package has a structure in which a sealing electrically insulating layer composed of a resin such as a polyimide is formed by a mold molding method on a semiconductor chip substrate, thereby sealing the semiconductor chip. In such a structure, the package size is the same as the chip size and high-density mounting is possible. A highly functional device is obtained by forming a receiving circuit and a transmitting circuit in the same semiconductor chip, and transmission and reception of high-frequency signals, modulation and demodulation of the signals, and processing of base band signals can be conducted in a single chip. Therefore, various high-frequency signals pass through input and output terminals of a single chip and high-frequency characteristics at the input and output terminals have to be taken into account.

A flip chip bonding (FCB) method has been suggested as a method for miniaturizing semiconductor devices. The flip chip bonding method represents a technology by which a plurality of solder balls are provided as input and output terminals on the surface of a semiconductor chip and the semiconductor chip is bonded to a package substrate via those solder balls, thereby making it possible to connect a large number of input and output terminals of the chip to the terminals of the package substrate, without using wire bonding, and to decrease the package size accordingly.

A variety of methods have been suggested for increasing the high-frequency characteristics of input and output terminals in semiconductor devices using such a flip chip bonding method. Examples of those methods are described in Japanese Patent Applications Laid-open No. H09-306917, H10-64953, and 2002-313930. Japanese Patent Application Laid-open No. H09-306917 described a structure in which, among the pads where solder bumps are formed, the surface area of high-frequency input and output pads which are used for inputting and outputting high-frequency signals is made small, whereas the surface area of other pads which are not used for inputting and outputting high-frequency signals is made large. In this structure, decreasing the surface area of high-frequency input and output pads which are used for inputting and outputting high-frequency signals makes it possible to decrease the parasitic impedance to the semiconductor substrate and to reduce the signal loss.

Japanese Patent Application Laid-open No. H10-64953 describes that when electrically conductive connection terminals called electrically conductive pillars are formed on a GaAs semiconductor substrate, the correlation between the opening diameter and the height of the connection terminals in a plating process is employed, short connection terminals are formed by reducing the opening diameter, long connection terminal are formed by increasing the opening diameter, and the heights of the connection terminals of the two types are adjusted. As a result, short connection terminals with a low resistance can be formed, and the impedance and capacitance of the connection terminals of a high-frequency semiconductor chip can be reduced.

Japanese Patent Application Laid-open No. 2002-313930 describes a semiconductor device obtained by flip chip bonding using a ball grid array, wherein shielding wiring layers connected to a reference potential are formed above and below a metal wiring, and a strip line structure is formed to obtain a constant characteristic impedance of the metal wiring where a high-frequency signal propagates.

The above-described Japanese Patent Applications Laid-open No. H9-306917, H10-64953, and 2002-313930 relate to flip chip bonding by which chips are bonded inside a package and the package size is larger than the chip size. Therefore, from the standpoint of miniaturization, the configurations of the above publications are different from that of the chip sized package.

An example of a chip sized package is described in Japanese Patent Application Laid-open No. 2003-243570. In this example, a sealing resin layer composed of a polyamide is formed on a semiconductor substrate, posts for input and output terminals are formed inside the sealing resin layer, and an impedance matching circuit of input/output terminals is formed by forming an inductor element on the interface of the semiconductor substrate and the sealing resin layer. Because the package state is obtained by forming a sealing resin layer on the surface of a semiconductor chip, the size can be reduced comparing to that of the package of a flip chip type, and a compact semiconductor device that can be installed in portable communication devices can be effectively obtained.

Thus, chip sized packages have an advantage over the flip chip packages in terms of miniaturization. However, the sealing electrically insulating layer or resin layer having a sealing function are much thicker than the multilayer wiring layers on the chip surface, the height of the electrically conductive posts formed in the resin layer becomes rather large, and the characteristics relating to high-frequency signals are seriously degraded. Of the high-frequency signals, with respect to low-power high-frequency signals, a configuration is required which allows the degradation of the loss characteristic thereof to be avoided, and with respect to high-power high-frequency signals, a configuration is required which has a sufficient current supply capability in addition to the loss characteristic. Furthermore, coupling of a high-frequency circuit on the mounting substrate with a high-frequency circuit on the semiconductor chip should be suppressed for a higher frequency band.

SUMMARY OF THE INVENTION

Accordingly, it is an object of the present invention to provide a high-frequency device whose size is decreased by using a chip sized package and high-frequency characteristic is improved.

In order to attain the aforementioned object, in accordance with the first aspect of the present invention, there is provided a high-frequency device comprising:

a semiconductor substrate;

a high-frequency circuit layer formed at a surface of the semiconductor substrate and including a circuit element and a multilayer wiring layer;

a plurality of electrically conductive pads formed on the high-frequency circuit layer and connected to an input and an output of high-frequency circuit and to a power source;

a plurality of rewiring layers formed on the high-frequency circuit layer via a first electrically insulating layer and respectively connected to the plurality of electrically conductive pads;

an electrically insulating sealing layer which is formed on the first electrically insulating layer and the rewiring layer and has a thickness larger than that of the multilayer wiring layer;

a plurality of mounting connection terminals which are provided on the electrically insulating sealing layer and correspond to the plurality of electrically conductive pads;

a plurality of electrically conductive posts provided inside the electrically insulating sealing layer and between the rewiring layer and the mounting connection terminals, wherein the high-frequency circuit of the high-frequency circuit layer includes an input amplifier for amplifying a high-frequency reception signal inputted from the electrically conductive post corresponding to the input and a power output amplifier for amplifying a high-frequency transmission signal and outputting the same from the electrically conductive post corresponding to the output, and further a first electrically conductive post corresponding to the power source has a first diameter;

a second electrically conductive post corresponding to the input of the input amplifier has a second diameter which is less than the first diameter; and a third electrically conductive post corresponding to the output of the power output amplifier has a third diameter which is larger than the second diameter.

The device of the preferred embodiment of the above-described first aspect comprises a first shielding layer provided on the high-frequency circuit layer, below the second or third electrically conductive post, and connected to a fixed potential.

The device of the preferred embodiment of the above-described first aspect comprises a second shielding layer which is an upper layer portion of the high-frequency circuit layer, provided below an electrically conductive pad connected to the second or third electrically conductive post, and connected to a fixed potential.

In order to attain the aforementioned object, in accordance with the second aspect of the present invention, there is provided a high-frequency device comprising:

a second shielding layer provided inside the multilayer wiring layer, below an electrically conductive pad connected to the second or third electrically conductive post, and connected to a fixed potential, and an inductor located over the high-frequency circuit layer, formed between the rewiring layers, and having a spirally wound structure, wherein an impedance matching circuit of the input amplifier or power output amplifier is composed of the inductor and a capacitance between the electrically conductive pad and the second shielding layer.

As a modification example in the above-mentioned second aspect, the impedance matching circuit is composed of a capacitance between the first shielding layer provided below the second or third electrically conductive posts and those electrically conductive posts. Alternatively, the impedance matching circuit is composed of a capacitance between the third shielding layer, provided below the second or third electrically conductive posts and electrically conductive pads connected thereto, and those electrically conductive pads.

In order to attain the aforementioned object, in accordance with the third aspect of the present invention, there is provided a high-frequency device module comprising a first high-frequency device for processing a signal of a first high-frequency band and a second high-frequency device for processing a signal of a second high-frequency band which is higher than the first high-frequency band, and the height of the electrically conductive posts of the second high-frequency device is larger than the height of the electrically conductive posts of the first high-frequency device.

With the above-described first aspect, when a high-frequency circuit is formed in a chip sized package having electrically conductive posts with a height larger than that of the multilayer wiring layer of an LSI, the allowed current value is increased by increasing the diameter of a post for a power source, the parasitic capacitance and parasitic resistance between a substrate and the long electrically conductive post are decreased and high-frequency signal loss is decreased by reducing the diameter of the receiving post corresponding to high-frequency reception signal, and the diameter of third electrically conductive post on the transmission side corresponding to a high-frequency transmission signal is increased with respect to the diameter of the second electrically conductive post on the reception side, thereby increasing the allowed current value, though the post is used for high-frequency signal. In chip sized package, electrically conductive posts with a large height increase loss or cause the degradation of high-frequency characteristic due to degradation of the Q value of the inductor. The above-described configuration serves to resolve this problem.

In the preferred embodiment of the first aspect, a configuration is employed in which in the third electrically conductive post on the transmission side which transmit high-frequency-signals, but have a diameter enlarged to ensure a large electric current, a first shielding layer is formed, the parasitic capacitance of the transmission posts is fixed to a predetermined value, and the parasitic resistance of the semiconductor substrate is suppressed so that the high-frequency characteristic is improved. As a result, the degradation of high-frequency characteristic of the electrically conductive post on the transmission side is suppressed.

In accordance with the second aspect, the impedance matching circuit can be composed of an inductor element having a spirally wound structure and formed between rewiring layers and a parasitic capacitance created by the shielding layer, and this impedance matching circuit can be formed with good efficiency.

In accordance with the third aspect, the height of the electrically conductive post is preferably decreased as much as possible to reduce loss on the electrically conductive post, but in a higher frequency band, the coupling effect between the circuits of the high-frequency circuit layer and the mounting substrate has to be suppressed by increasing the distance therebetween. Accordingly, the electrically conductive post of the high-frequency device for a higher frequency band are made higher, and the electrically conductive post of the high-frequency device for a lower frequency band are made lower. In a low-frequency band, the aforementioned coupling effect is weak. Therefore, loss increase is suppressed by further decreasing the height of the electrically conductive post.

BRIEF DESCRIPTION OF THE DRAWINGS

FIG. 7 illustrates a structural example of a receiving post and a transmitting post;

FIG. 8 illustrates another structural example of a receiving post and a transmitting post;

FIG. 11 is a graph illustrating the relation between frequency and loss for a plurality of diameters of electrically conductive posts;

FIG. 12 is a graph illustrating the relation between frequency and loss obtained with and without an electrically conductive shielding layer for a plurality of diameters of electrically conductive posts;

DESCRIPTION OF THE PREFERRED EMBODIMENTS

Embodiments of the present invention will be described below with reference to the appended drawings. However, the scope of the present invention is not limited to those embodiments and covers the inventions described in the patent claims and equivalents thereof.

Figure 1:
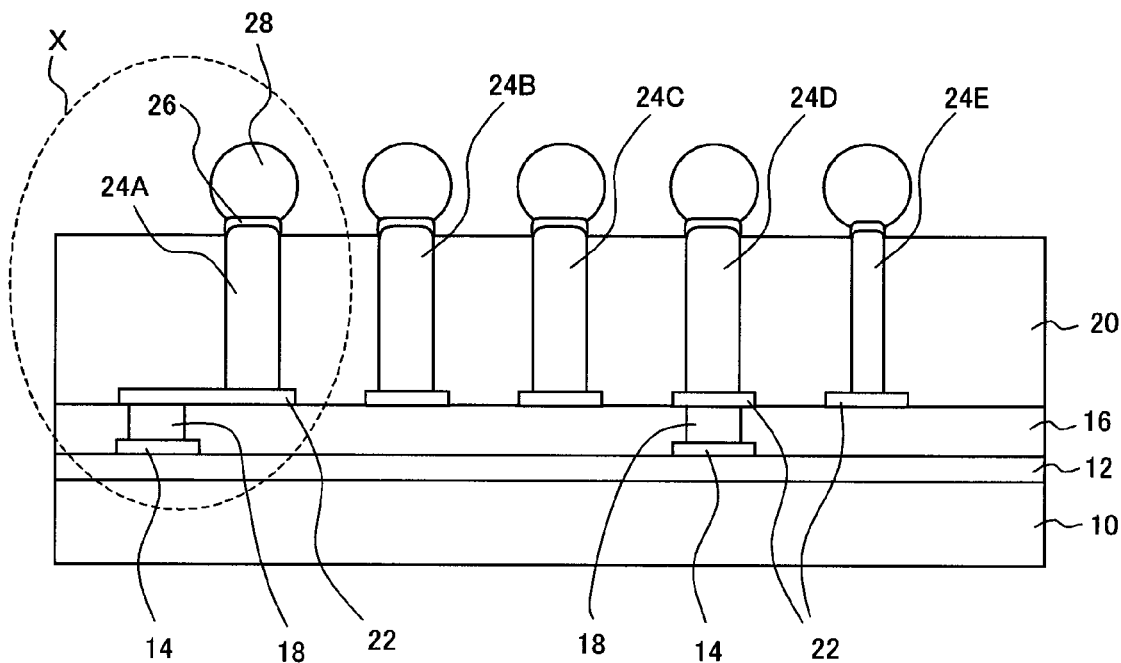
FIG. 1 is a cross-sectional view of a high-frequency device of the present embodiment.

FIG. 1 is a cross-sectional view of a high-frequency device of the present embodiment. At the surface of a silicon semiconductor substrate 10, there are formed circuit elements such as transistors which together with a multilayer wiring layer 12 connecting the circuit elements constitutes a high-frequency circuit layer. The high-frequency circuit, as described hereinbelow, is composed of circuit elements such as transistors, an input, an output, a power source, ground, and the like. An electrically conductive pad 14 is formed as the topmost electrically conductive layer of the multilayer wiring layer 12 and connected to wiring (not shown in the figure) located inside the multilayer wiring layer 12. A first electrically insulating layer 16 composed of a polyimide and formed by a coating method is formed on the multilayer wiring layer 12, and a rewiring circuit 22 connected to the electrically conductive pad 14 is formed thereon. The rewiring layer 22 and the electrically conductive pad 14 are connected with a via hole 18 provided in the first electrically insulating layer 16.

Further, electrically conductive posts 24A–24E are formed on the rewiring layer 22, and solder bumps 28 are formed via a barrier metal layer 26 on the upper ends of the electrically conductive posts 24. Further, a sealing electrically insulating layer 20 composed of a resin such as a polyimide is formed on the first electrically insulating layer 16 and rewiring layer 22 so as to fill the space between the electrically insulating posts 24. The sealing electrically insulating layer 20 has a thickness larger than that of the multilayer wiring layer 12, thereby completely sealing the semiconductor chip surface and providing for a high strength of the package. Therefore, the configuration shown in FIG. 1 provides a package structure with a semi-conductor chip sealed therein, the package size being equal to that of the semiconductor chip. In other words, it is the chip sized package structure.

Figure 2:
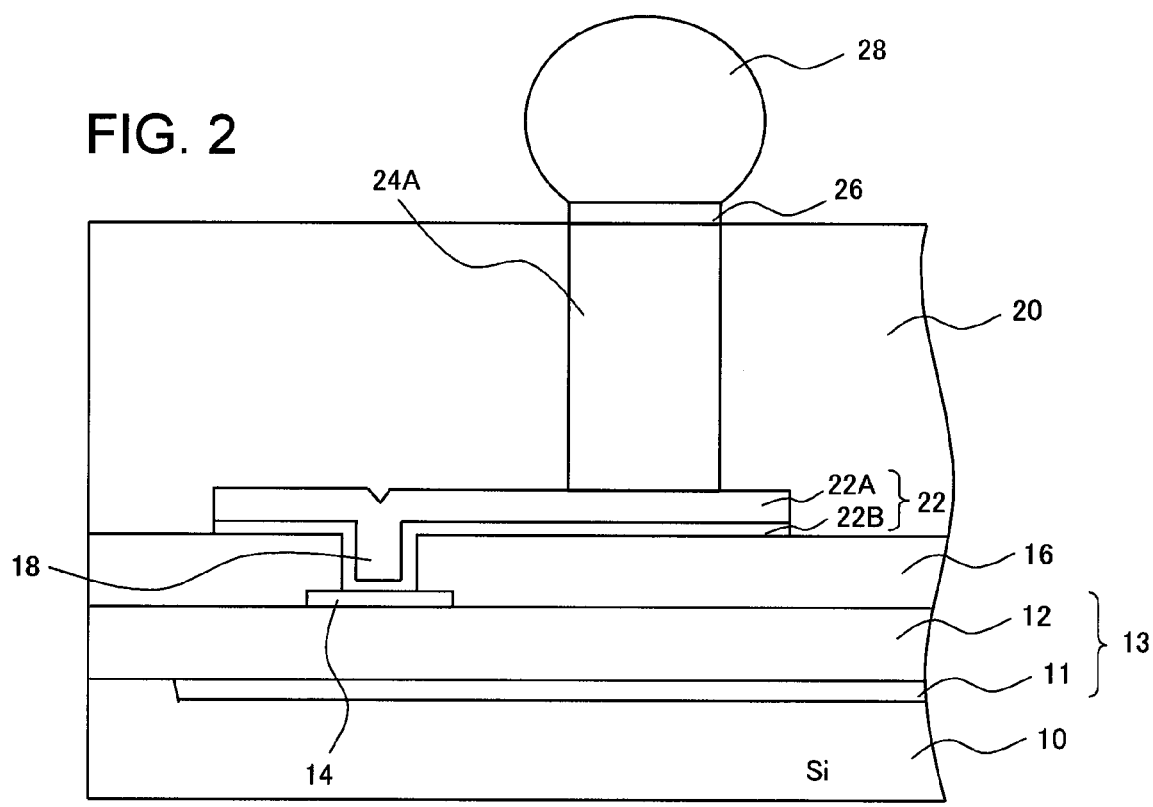
FIG. 2 is a cross-sectional view in which part X shown in FIG. 1 was enlarged.

FIG. 2 is an enlarged cross-sectional view of portion X shown in FIG. 1. Circuit elements such as transistors that are formed at the surface 11 of the silicon semiconductor substrate 10 are connected by the wiring of the multilayer wiring layer 12 located thereupon and constitute a high-frequency circuit 13. The first electrically insulating layer 16 composed of a polyimide or the like is formed on the electrically conductive pads 14 composed of aluminum or the like that are formed on the surface of the multilayer wiring layer 12. Contact holes are formed at the positions corresponding to the electrically conductive pads 14 in the first electrically insulating layer 16, a seed metal layer 22B is formed by a sputtering method or the like, and a comparatively thick copper plated layer 22A is formed by a plating process on this seed metal layer 22B. The seed metal layer 22B and copper plated layer 22A constitute the rewiring layer 22.

Further, a resist layer (not shown in the figure) is formed, an opening is formed at the position where an electrically conductive post is formed, and the electrically conductive post 24A having a prescribed height is formed by a copper plating process inside the opening. At the position of the electrically conductive post 24A, the rewiring layer 22 has a cylindrical pad shape with a diameter larger than that of the electrically conductive post 24A. Then, a sealing electrically insulating layer 20 of a polyimide or the like is formed by a molding process on the first electrically insulating layer 16 so that the high-frequency circuit layer 13 is sealed from the outside. Then a barrier metal layer 26 and a solder bump 28 are formed on the upper end of the electrically conductive post 24A.

In order to conduct complete sealing from the outside and to ensure a certain package strength, the sealing electrically insulating layer 20 is formed to have a thickness of, for example, 70 μm. Therefore, the sealing electrically insulating layer 20 is formed to have a thickness larger than that of the multilayer wiring layer 13 or the first electrically insulating layer 16. As a result, the height of the electrically conductive posts 24A–24E formed by embedding in the sealing electrically insulating layer 20 is larger than that of the multilayer wiring layer 13. With the electrically conductive posts having such a large height, when a high-frequency signal is transmitted, the impedance of the posts themselves together with a parasitic capacitance between the electrically conductive posts and the silicon semiconductor substrate 10 or the surrounding electrically conductive substances or the parasitic resistance of those substances affect the high-frequency characteristics. In particular, the parasitic capacitance or parasitic resistance increase the loss of high-frequency signals transmitted from the eclectically conductive posts 24. Therefore, it is desired that the diameter of the electrically conductive posts for transmitting high-frequency signals be as small as possible and that the parasitic capacitance or parasitic resistance connected thereto be reduced.

Further, because the electrically conductive posts have a diameter larger than that of the wiring or via hole in the multilayer wiring layer 12, their coupling with the high-frequency signal of the high-frequency circuit located inside the semiconductor substrate becomes comparatively large. In particular, if the cost of the silicon semiconductor substrate 10 is desired to be reduced, then a silicon substrate with a low resistance (for example, 0.001–10 Ω) has to be used instead of a high-resistance GaAs substrate. If the semiconductor substrate 10 has the low resistance, then the signal of the high-frequency circuit located in the substrate will affect the electrically conductive posts via the substrate. Therefore, it is desirable to provide the electrically conductive posts for transmitting high-frequency signals with a shield structure such that suppresses coupling with other high-frequency circuits.

On the other hand, when the electrically conductive post is used for a supply terminal of a ground power supply, it is desirable to decrease the impedance thereof while increasing the allowable current. Further, even if a high-frequency signal is transmitted, when the electrically conductive post corresponds to an output terminal of a power amplifier or the like, it is preferred that a high current supply capability be provided in addition to the improvement of high-frequency characteristic. In order to meet this required, it is desired that the diameter of the electrically conductive post be comparatively large. However, because there are problems associated with signal loss and coupling, a structure that resolves those problems has to be provided additionally or separately.

In the example illustrated by a cross-sectional view in FIG. 1, the diameter of the electrically conductive post 24E, which is one of the electrically conductive posts, is reduced and this electrically conductive post 24E is used as a post that transmits a high-frequency signal but does not require such a high electric current supply capability. The diameter of other electrically conductive posts 24A–24D is larger than the above post 24E and they are used as posts that require a high electric current supply capability. Because the electrically conductive posts are very high, the size of the diameter thereof has to be optimized depending on which input or output terminals of a high-frequency circuit is connected to the post, as described hereinabove.

Figure 3:
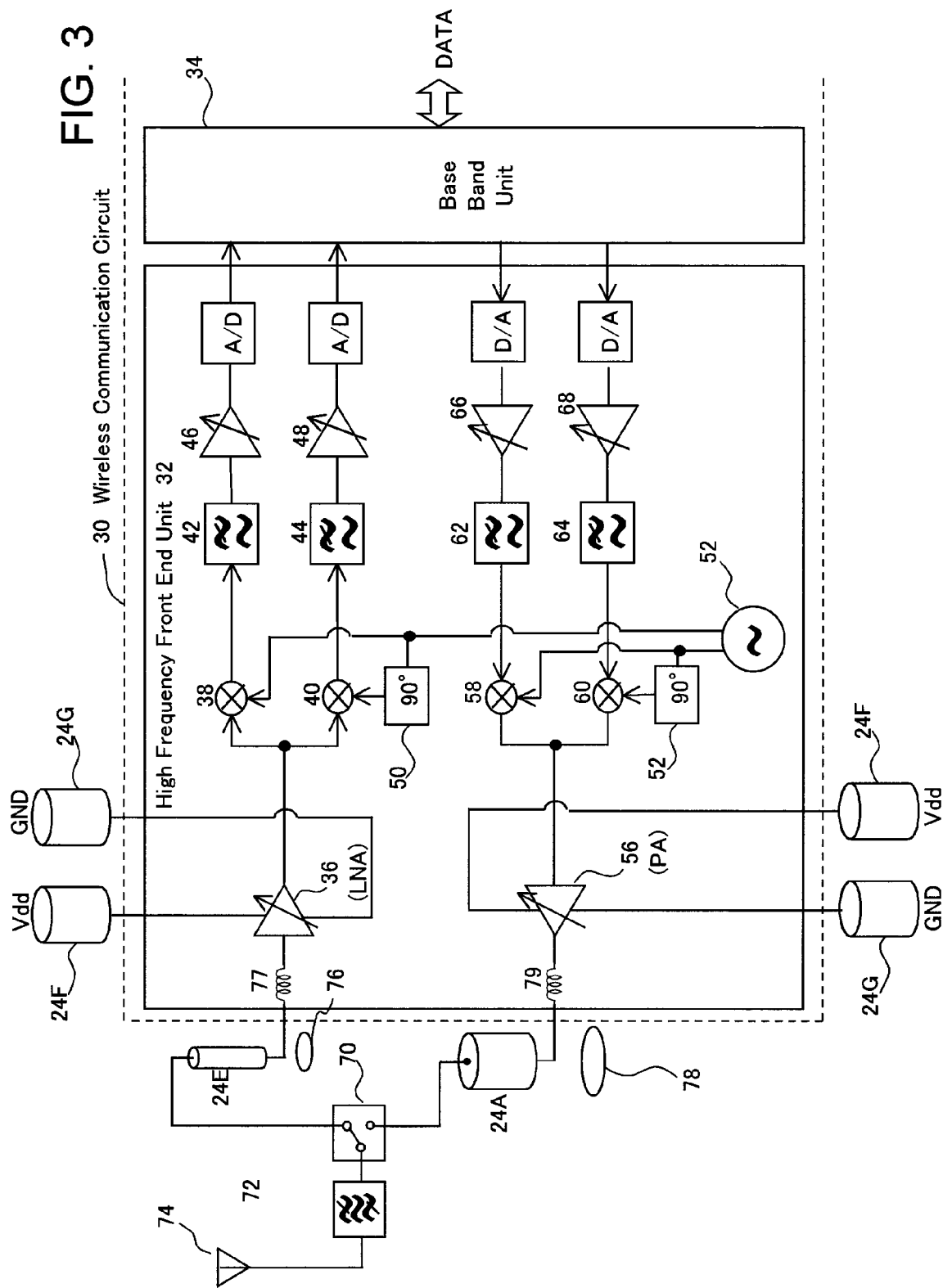
FIG. 3 illustrates the relation between a high-frequency circuit and electrically conductive posts in the present embodiment.

FIG. 3 illustrates the relation between the electrically conductive post and the high-frequency circuit in the present embodiment. A wireless communication circuit 30 is composed of circuit elements at a semiconductor substrate surface and a multilayer wiring layer and has a high-frequency front-end unit 32 which is a high-frequency circuit, a base band unit 34, and a data processing unit (not shown in the figures) which is connected to the base band unit 34 for conducting a prescribed data processing. The high-frequency front end unit 32, for example comprises a reception high-frequency circuit composed of a low-noise amplifier 36 (LNA) which is a preamplifier on the reception side, orthogonal demodulator 38, 40, 50, low-pass filters 42, 44, and amplifiers 46, 48, and analog-digital converters A/D, and a transmission high-frequency circuit composed of digital-analog converters D/A, amplifiers 60, 68, low-pass filters 62, 64, orthogonal modulator 58, 60, 52, and a power amplifier 56 (PA) which is an output amplifier. An oscillation signal generated by a local oscillator 52 is supplied directly or via 90° phase shift circuits 50, 52 to the orthogonal demodulators 38, 30 and orthogonal modulators 58, 60.

A high-frequency reception signal is transmitted via an antenna 74 provided outside the chip size package, a bandpass filter 72, and an input/output switch 70 to the reception posts 24E and an input matching inductor 77, and inputted in the low-noise amplifier 36. Therefore, the receiving post 24E is formed to have a comparatively small diameter so as to cause no loss in small-power high-frequency signals. Decreasing the diameter makes it possible to reduce a parasitic capacitance, for example, of the sealing resin layer 20 connected to the post 24E or a parasitic resistance in the semiconductor substrate connected to this parasitic capacitance and to minimize the loss of the high-frequency signal caused by those parasitic capacitance and parasitic resistance. Furthermore, an electrically conductive shielding layer 76 connected to a fixed electric potential such as a ground potential is provided between the receiving post 24E and the semiconductor substrate, or between the electrically conductive pad connected to the receiving post 24E and the semiconductor substrate. The electrically conductive shielding layer 76 makes it possible to reduce the parasitic capacitance to a predictable level and to suppress the effect of parasitic resistance created by the semiconductor substrate. Furthermore, a coupling effect with other high-frequency circuits of the semiconductor substrate can be also suppressed.

On the other hand, the high-frequency transmission signal which is the output of the power amplifier 56 propagates through the output matching inductor 79 and output post 24A and is transmitted via the input/output switch 70, bandpass filter 72, and high-frequency antenna 74. In order to transmit the high-power high-frequency transmission signal with the power amplifier 56, the transmitting post 24A is formed so that the diameter thereof is larger than that of the input post 24E. Increasing the diameter enlarges the cross-sectional area of the transmitting post, decreases the impedance thereof, and allows a large current to be supplied. Further, increasing the diameter of the transmitting post 24A also increases the parasitic capacitance or parasitic resistance and increases loss. In order to control this, an electrically conductive shielding layer 78 connected to a fixed electric potential such as a ground potential is provided between the transmitting post 24A and the semiconductor substrate, or between the electrically conductive pad connected to the transmitting post 24A and the semiconductor substrate. The electrically conductive shielding layer 78 makes it possible to reduce the parasitic capacitance to a predictable level and to suppress the effect of parasitic resistance created by the semiconductor substrate. Furthermore, a coupling effect with other high-frequency circuits of the semiconductor substrate can be also suppressed.

The low-noise amplifier 36 and power amplifier 56 are connected to a power source Vdd or ground GND. Accordingly, those amplifiers are connected to the power source post 24F and the ground post 24G. Those power source and ground posts are formed to have a large diameter so that they can supply a large electric current and can prevent the ground potential of the low-noise amplifier or power amplifier from floating. In other words, those posts 24F, 24G have a diameter larger than at least the diameter of the receiving post 24E and, if necessary, larger than the diameter of the transmitting post 24A. For example, those posts 24F, 24G can be realized in FIG. 1, for example, by posts 24B, 24C, 24D that have a diameter larger than that of the post 24E.

Figure 4:
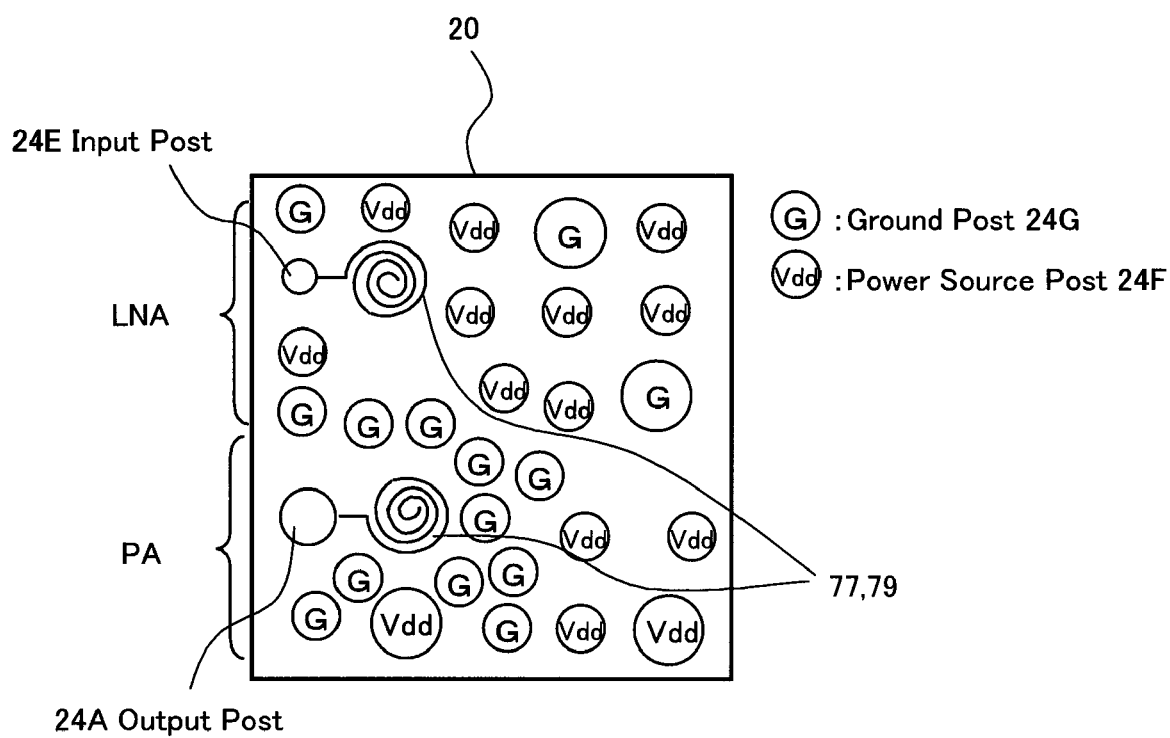
FIG. 4 is a plan view of the mounting surface side of the semiconductor device of the present embodiment.

FIG. 4 is a plan view on the mounting surface side of a semiconductor device in the present embodiment. Solder bumps are not shown in this plan view. On the mounting surface side, the sealing resin layer 20 is formed, and a plurality of electrically conductive posts are embedded in the sealing resin layer 20. The input posts (receiving post) 24E and the output post (transmitting post) 24A of the above-described diameters are formed on the side of the low-noise amplifier (LNA) and power amplifier (PA), respectively. Furthermore, the power source post 24F and the ground post 24G are formed to have respective large diameters. Further, the spiral inductors 77, 79 connected to the input post 24E and output post 24A are formed by using the rewiring layer 22 on the first electrically insulating layer 16 shown in FIGS. 1 and 2.

Though it is slightly unclear in FIG. 4, the input post 24E and output post 24A are provided at a prescribed distance from the surrounding posts in order to prevent short circuiting with the surrounding posts. As a result, the input posts or output posts are arranged with a low density. By contrast, a plurality of ground posts 24G are provided to improve the high-frequency characteristic (ground intensification), reduce thermal resistance, and increase the allowed electric current, and because mutual short circuiting thereof is allowed, they are arranged with a high density. The power source posts 24F are arranged similarly to the ground posts. When a plurality of input posts or output posts are provided, they may be arranged with a high density.

Figure 5:
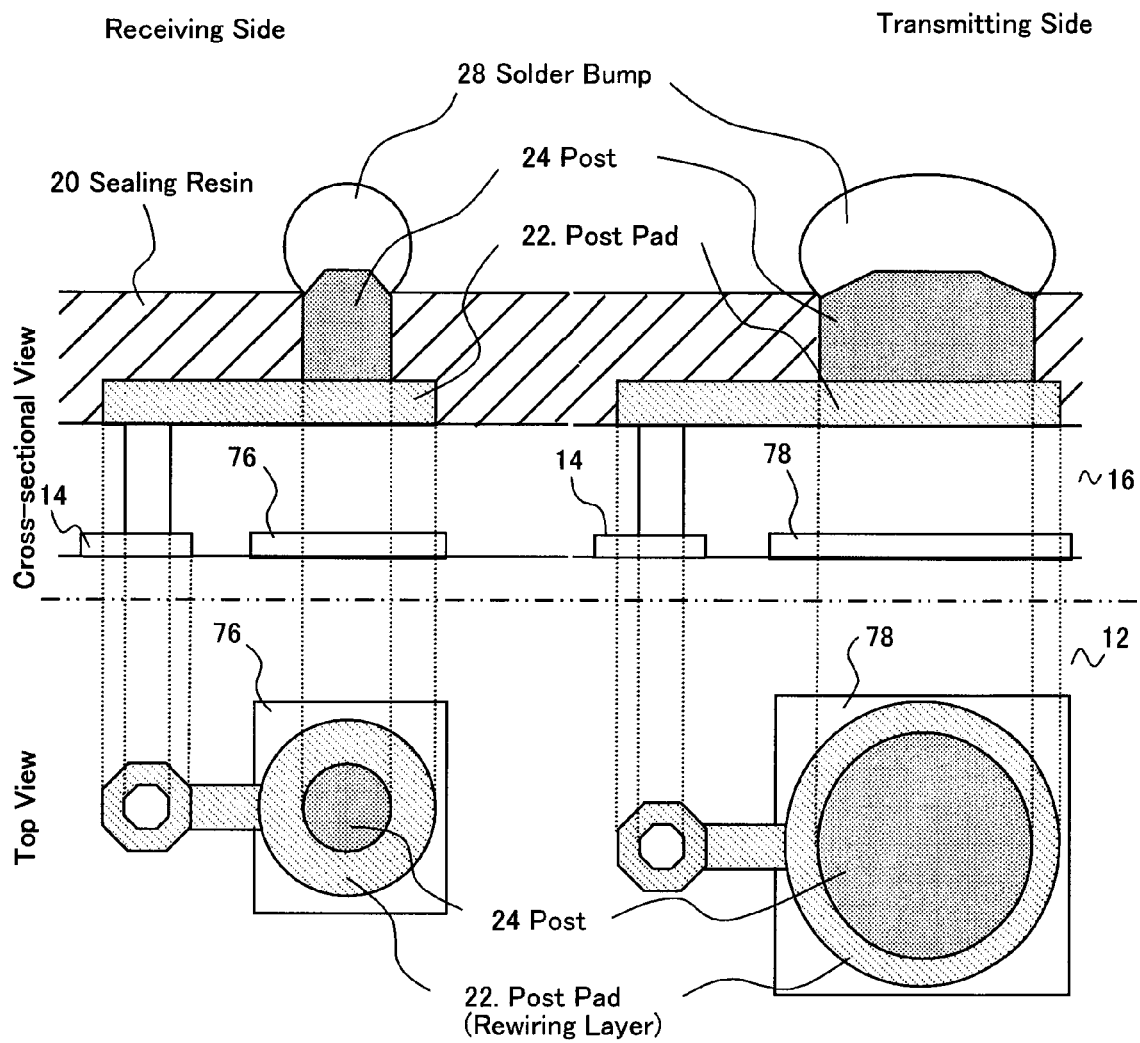
FIG. 5 illustrates a structural example of a receiving post and a transmitting post of the present embodiment.

FIG. 5 illustrates a structural example of the receiving post and transmitting post of the present embodiment. Here, the upper figure is a cross-sectional view and the lower figure is a top view. The transmitting post is shown at the right side, and the receiving post is shown at the left side. As described hereinabove, the electrically conductive posts 24 are formed so that the diameter of the receiving post is less than that of the transmitting post. Furthermore, electrically conductive shielding layers 76, 78 connected to a fixed electric potential such as ground penitential are formed between the posts 24 and the semiconductor substrate. More specifically, those electrically conductive shielding layers 76, 78 are formed from an aluminum layer similarly to the electrically conductive pad 14 located on the multilayer wiring layer 12, and preferably those shielding layers have a rectangular shape with a length, or a round shape with a diameter larger than the diameter of the electrically conductive posts 24 or the diameter of the post pad 22. The electrically conductive shielding layers 76, 78 may be formed by embedding in the multilayer wiring layer 12.

Forming such electrically conductive shielding layers 76, 78 makes it possible to form a fixed parasitic capacitance with the electrically conductive posts 24 transmitting a high-frequency signal and to obtain a predictable value of the parasitic capacitance connected to the electrically conductive posts 24. Furthermore, because the electrically conductive shielding layers 76, 78 are formed between the electrically conductive posts 24 and the semiconductor substrate (not shown in the figure), a parasitic resistance present in the semiconductor substrate is not connected to the electrically conductive posts 24. Thus, providing the electrically conductive shielding layers 76, 78 between the electrically conductive posts and the semiconductor substrate makes it possible to suppress the signal loss and is advantageous for both the receiving posts and the transmitting posts that transmit high-frequency signals. The shielding layer is especially effective for suppressing signal loss in transmitting posts in which the post diameter is increased to ensure the supply of a high electric current.

However, though the presence of the electrically conductive shielding layers makes it possible to suppress the parasitic resistance of the semiconductor substrate, however, it provides the electrically conductive posts with a fixed parasitic capacitance. In a comparatively low frequency band, because the parasitic resistance produces a larger effect on signal loss than the parasitic capacitance, the decrease in parasitic resistance contributes to loss reduction. On the other hand, in a high-frequency band, because the parasitic capacitance produces larger effect on signal loss than the parasitic resistance, providing the electrically conductive shielding layers sometimes becomes unnecessary.

Forming the electrically conductive shielding layers in the multilayer wiring layer 12 between the electrically conductive pad 14 and the semiconductor substrate is also effective. This is because such a formation makes it possible to obtain a predictable value of parasitic capacitance and to suppress the parasitic resistance of the substrate. This case will be described below in greater detail.

Figure 6:
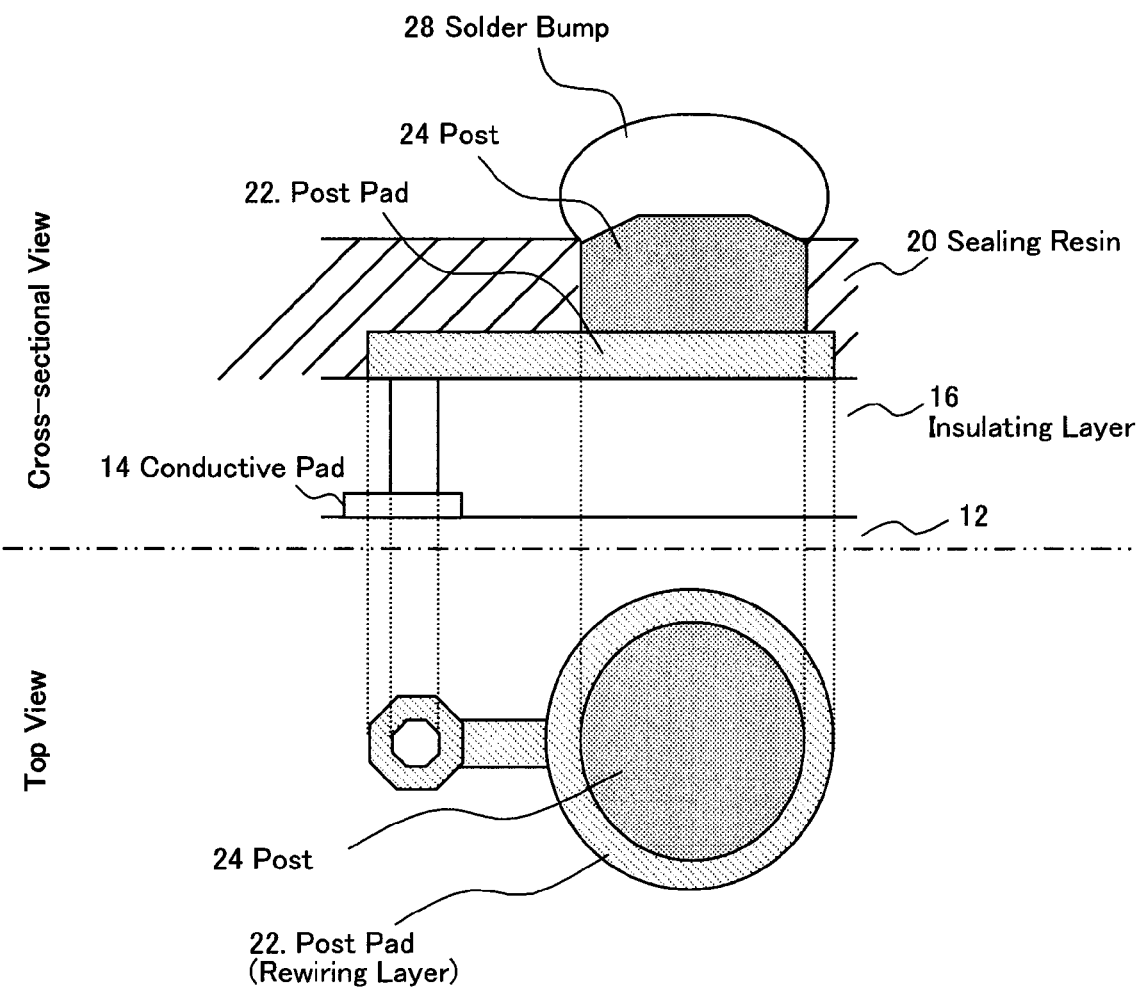
FIG. 6 illustrates a structural example of a power source post and a ground post of the present embodiment.

FIG. 6 illustrates a structural example of a power source post and a ground post in the present embodiment. In those posts 24, the diameter is increased, the allowed electric current is increased, and their own impedance is suppressed. Because those posts do not transmit a high-frequency signal, no shielding layer is formed.

FIG. 7 illustrates a structural example of a receiving post or a transmitting post. In the figure, FIG. 7A is a top view, FIG. 7B is a cross-sectional view, and FIG. 7C, FIG. 7D are perspective views. In this structural example, as shown by a top view FIG. 7A and cross-sectional view FIG. 7B, the electrically conductive posts 24 and the electrically conductive pad (via pad) 14 are at a prescribed distance from each other. The electrically conductive pad 14 has a round shape with a diameter larger than the diameter of the via hole 18 and is formed from a metal layer of the uppermost layer of the multilayer wiring layer 12.

When the two posts are at a prescribed distance from each other, a first electrically conductive shielding layer 80 is formed in the same layer as the electrically conductive pad 14 located below the electrically conductive posts 24, and a second electrically conductive shielding layer 82 is formed in the multilayer wiring layer 12 located below the electrically conductive pad (via pad) 14. The first electrically conductive shielding layer 80 is formed by the uppermost metal layer of the multilayer wiring layer 12. Forming the two shielding layers 80, 82 can bring the parasitic capacitance with the semiconductor substrate 10 close to a predictable fixed value, to suppress the parasitic resistance induced by the semiconductor substrate, and to suppress coupling with other high-frequency circuits. Fixing the parasitic capacitance, as described hereinbelow, allows it to be used as a capacity element of an impedance matching circuit. Furthermore, suppressing the parasitic resistance makes it possible to suppress the high-frequency signal loss.

FIG. 8 shows another structural example of the receiving post and transmitting post. In the figure, FIG. 8A is a top view, FIG. 8B is a cross-sectional view, and FIG. 8C is a perspective view. This example is a structural example illustrating the case in which the electrically conductive posts 24 and electrically conductive pad (via pad) 14 overlap as planes or come close to each other, as shown in a top view FIG. 8A and cross-sectional view FIG. 8B. When the electrically conductive posts 24 and electrically conductive pad (via pads) 14 overlap or come close to each other, a shielding layer composed of a metal layer of the uppermost layer on the multilayer wiring layer 16 cannot be formed below the electrically conductive posts 24. Accordingly, in such a configuration, a shielding layer 82 is formed inside the multilayer wiring layer 12. As shown in the top view FIG. 8A or perspective view FIG. 8C, this shielding layer 82 is formed so as to shield all the electrically conductive posts 24, post pads 22 thereof, and electrically conductive pads (via pads) 14 from the semiconductor substrate 10. In other words, as viewed from the top surface, the shielding layer has an elliptical shape including all the electrically conductive posts 24, post pads 22 thereof, and electrically conductive pads (via pads) 14. In this configuration, an elliptical shape is shown as an example, but any shape can be employed, provided that shielding is possible. This shielding layer 82 is connected to a fixed potential such as a ground potential, forms a predetermined parasitic capacitance between the electrically conductive posts or electrically conductive pads, and suppresses the parasitic resistance created by the semiconductor substrate 10.

The high-frequency device in the present embodiment may have any of the configurations shown in FIG. 7 and FIG. 8, or may have both configurations. With any of the configurations, the degradation of characteristics (loss increase) caused by parasitic capacitance or parasitic resistance for the signal transmission path connected to the electrically conductive post through which a high-frequency signal is transmitted can be suppressed.

Figure 9:
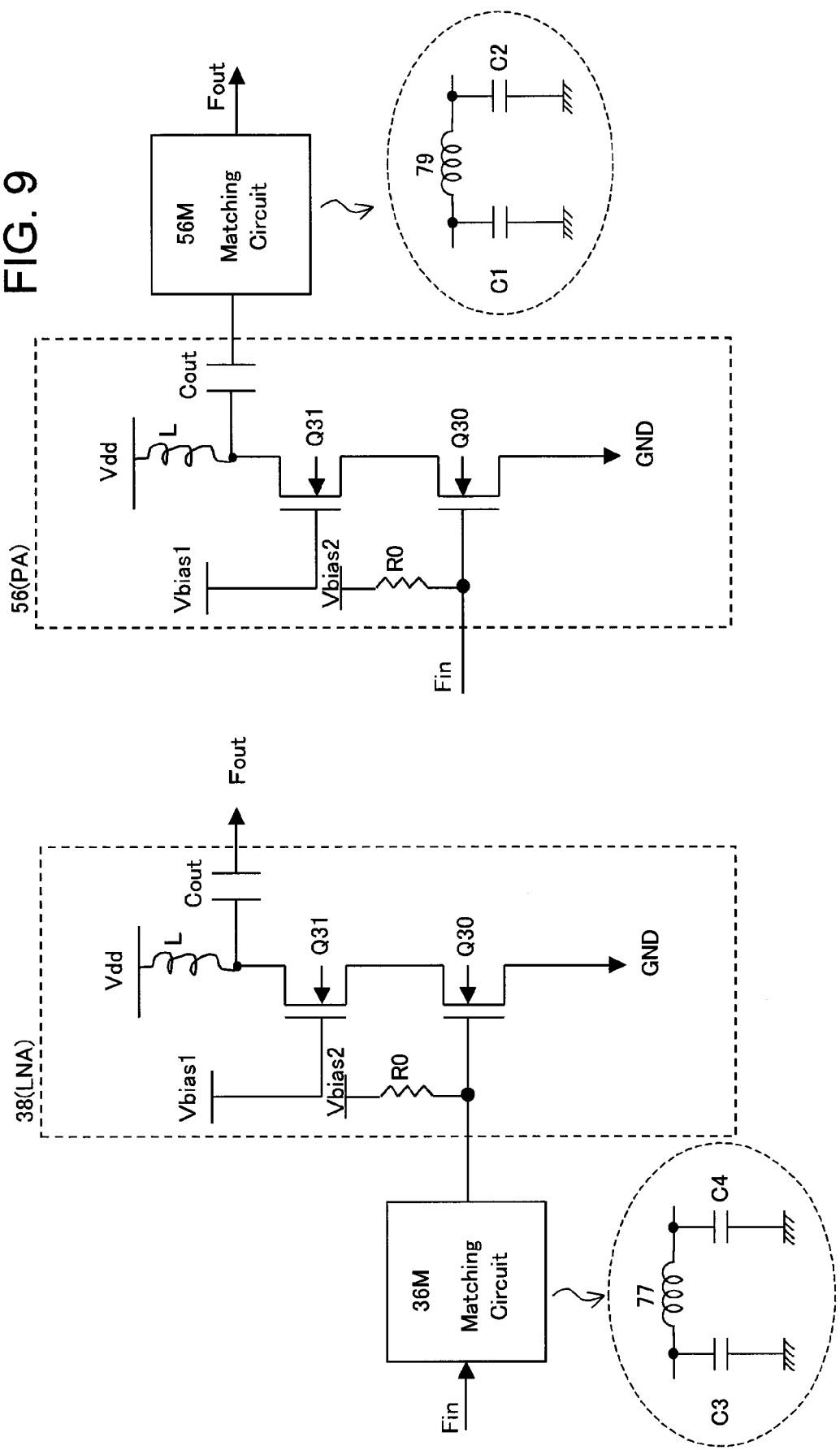
FIG. 9 illustrates a circuit example of a receiving low-noise amplifier and a transmitting power amplifier.

FIG. 9 shows an example of circuits of a receiving low-noise amplifier and a transmitting power amplifier. The low-noise amplifier 38, as shown in FIG. 3, inputs a high-frequency reception signal via an antenna 74, a bandpass filter 72, a switch 70, the receiving post 24E, and an impedance matching circuit 36M. The impedance matching circuit 36M is composed, for example, of the inductor 77, a parasitic capacitance to an electrically conductive shielding layer, and capacitances C3, C4 formed elsewhere.

The low-noise amplifier 38 is composed, for example, of N-channel MOS transistors Q30, Q31 that are cascade connected in the longitudinal direction. Bias voltages Vbias1, 2 are applied to those transistors Q30, Q31, respectively. The source of transistor Q30 is connected to ground GND, and the drain of transistor Q31 is connected to a power source Vdd via an inductor L and generates an output signal Fout via a coupling capacitor Cout. This output signal Fout is supplied to an orthogonal demodulator, as shown in FIG. 3.

The transistor Q30 generates on the drain terminal a high-frequency signal amplified the high-frequency reception signal applied to the gate, and the transistor Q31 generates on the drain terminal a high-frequency signal further amplified this amplified high-frequency signal. Thus, the two transistors that are cascade connected provide a large amplification ratio.

The power amplifier 56 on the transmission side has a circuit configuration basically identical to that of the low-noise amplifier 38. A high-frequency signal Fin supplied from the orthogonal modulator shown in FIG. 3 is amplified by the transistors Q30, Q31, and a power amplified high-frequency signal is outputted via the coupling capacitor Cout. This signal Fout is outputted to the antenna via the impedance matching circuit 56M. The impedance matching circuit 56M is composed, similarly to the low-noise amplifier, of an inductor 79 and capacitances C1, C2 formed in the signal transmission path.

Figure 10:
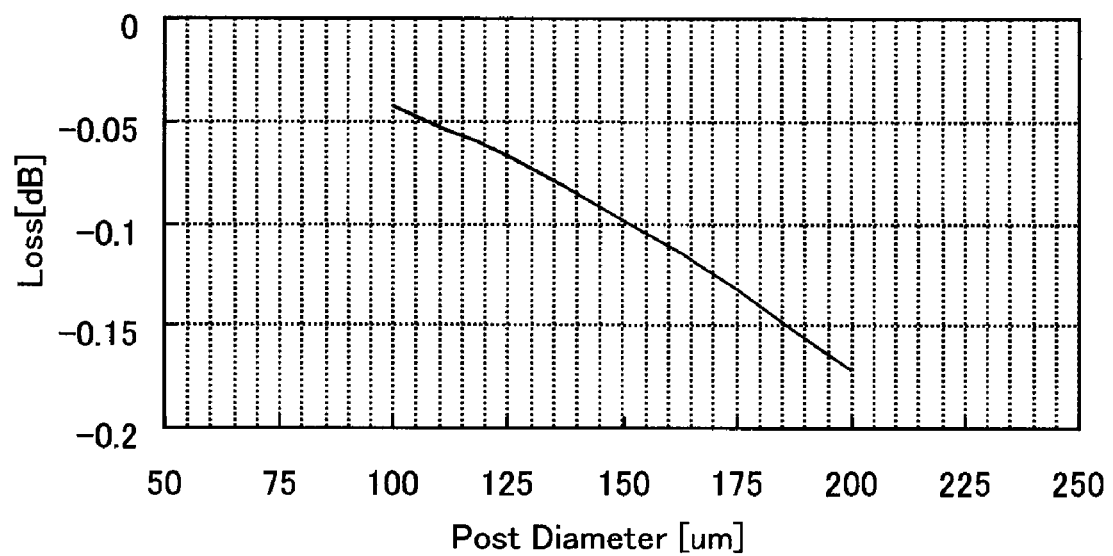
FIG. 10 is a graph illustrating the relation between the diameter of an electrically conductive post and loss.

FIG. 10 is a graph illustrating the relation between the diameter of electrically conductive posts and loss. A post diameter ($\mu$m) is plotted against the abscissa, and loss is plotted against the ordinate. The height of the electrically conductive posts is about 70 $\mu$m, and the figure shows loss relating to a high-frequency signal with a frequency of 5 GHz. The graph clearly shows that the signal loss is larger when the post diameter is 200 $\mu$m than when the post diameter is 100 $\mu$m. Thus, if the frequency band is raised, the increase in the diameter of electrically conductive posts results in a large signal loss. Therefore, because the increase in signal loss leads to degradation of noise FIG. NF, it is desired that the diameter especially of a receiving post be as small as possible.

FIG. 11 is a graph illustrating the relation between frequency and loss for a plurality of diameters of electrically conductive posts. Frequency is plotted against the abscissa, loss is plotted against the ordinate, and the figure shows the relation between frequency and loss for diameters of five different electrically conductive posts (circle: diameter 200 $\mu$m, square: 175 $\mu$m, triangle: 150 $\mu$m, X: 125 $\mu$m, diamond: 100 $\mu$m). The height of the electrically conductive posts of the sample is 70 $\mu$m. This graph clearly demonstrates that loss decreases with the post diameter as the frequency increases. Therefore, it is desired that the diameter of the electrically conductive post through which a high-frequency signal is transmitted is further decreased as the signal frequency band further rises.

FIG. 12 shows a graph illustrating the relation between frequency and loss obtained when the electrically conductive shielding layer is provided and without such a layer for a plurality of diameters of electrically conductive posts. Frequency is plotted against the abscissa, loss is plotted against the ordinate, and the figure shows the relation between frequency and loss for diameters of four different electrically conductive posts (circle: diameter 200 $\mu$m, no shielding layer; diamond 100 $\mu$m, no shielding layer; triangle: 200 $\mu$m, shielding layer is present; X: 100 $\mu$m, shielding layer is present). The height of the electrically conductive posts of the sample is 70 $\mu$m, as in the above-described case.

As follows from this graph, even if the post diameter is the same, loss in a comparatively low frequency band becomes less when a ground shielding layer is formed. However, as shown by an example relating to a post diameter of 200 $\mu$m, in a comparatively high frequency band, when ground shielding layer is provided, the loss conversely increases. This is because forming the ground shielding layer results in the formation of a fixed parasitic capacitance, but suppresses the parasitic resistance of the semiconductor substrate. Therefore, the loss caused by parasitic capacitance in a high-frequency band becomes dominant over that in a low-frequency band and a reversal occurs in the loss. Therefore in high-frequency devices operating in a comparatively low frequency band, a ground shielding layer is preferably provided to electrically conductive posts transmitting high-frequency signals, and in high-frequency devices operating in a comparatively high frequency range, it is preferred that no ground shielding layer be provided.

Figure 13:
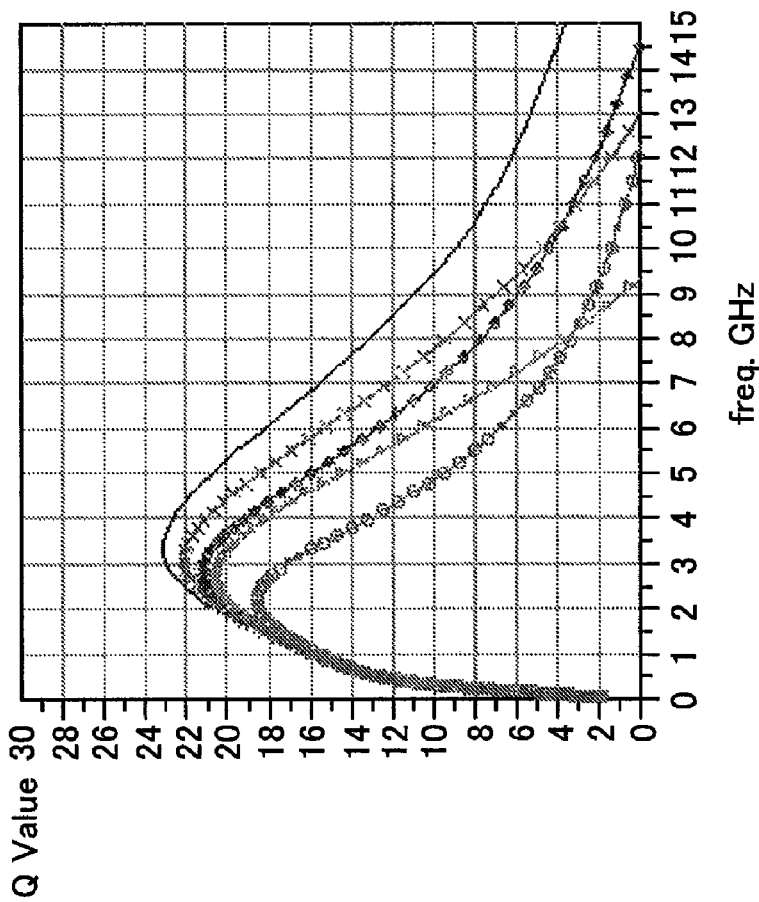
FIG. 13 is a graph illustrating the relation between frequency and Q value of an inductor for a plurality of diameters of electrically conductive posts.

FIG. 13 illustrates the relation between frequency and a Q value of an inductor for a plurality of diameters of electrically conductive posts. In samples, an inductor formed from a rewiring layer is connected to the electrically conductive post. Electrically conductive post structures of four types are used, representing the combinations of diameters of post of two types with the presence or absence of a shielding layer (circle: diameter 200 $\mu$m, no shielding layer; triangle: diameter 200 $\mu$m, shielding layer is present; diamond: diameter 100 $\mu$m, no shielding layer; X: diameter 100 $\mu$m, shielding layer is present). No symbol represents a Q value of the inductor only. If the electrically conductive post is connected to the inductor, the Q value decreases (degrades), and the larger is the diameter of the electrically conductive post, the larger is this decrease. Furthermore, when the diameter of post is the same, in a comparatively low frequency band, the decrease in Q value is less when the shielding layer is provided, but in a comparatively high frequency band, the decrease in Q value is less when no shielding layer is provided. In other words, the reduction is observed which is identical to the reversal phenomenon illustrated by FIG. 12.

The above-described test results suggest the following. (1) With respect to an electrically conductive post that transmits high-frequency signal and does not require the supply of a high electric current, loss can be suppressed by decreasing the diameter of the post. (2) In high-frequency devices operating in a comparatively low frequency band, signal loss is preferably suppressed by forming an electrically conductive shielding layer to a receiving post or a transmitting post, and in high-frequency devices operating in a comparatively high frequency band, signal loss is preferably suppressed without forming the electrically conductive shielding layer. (3) Further, with respect to an electrically conductive post connected to an inductor, in high-frequency devices operating in a comparatively low frequency band, the degradation of Q value is preferably suppressed by forming an electrically conductive shielding layer, and in high-frequency devices operating in a comparatively high frequency band, the degradation of Q value is preferably suppressed without forming the electrically conductive shielding layer.

Figure 14:
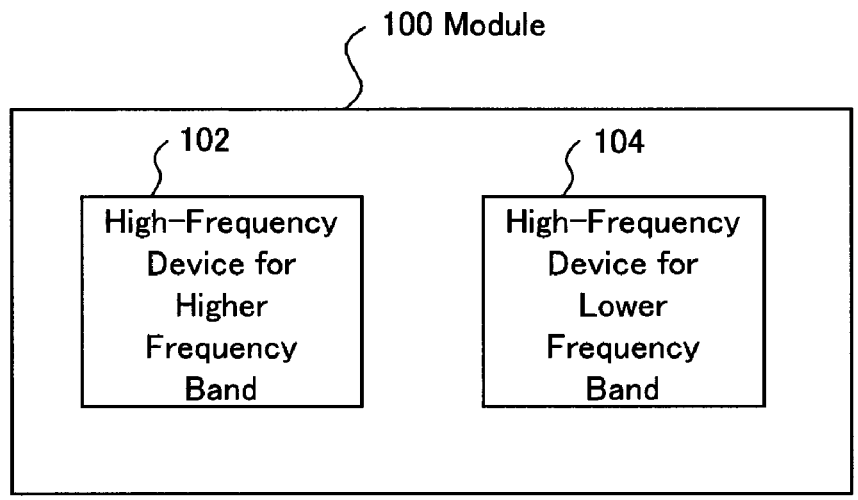
FIG. 14 is a structural diagram of a high-frequency device module of the second embodiment.

FIG. 14 shows the configuration of a high-frequency device module of the second embodiment. In this high-frequency device module 100, a high-frequency device 102 for processing signals in a higher frequency band and a high-frequency device 104 for processing signals in a lower frequency band than the device 102 are mounted on a common module substrate. The respective high-frequency device 104 is a high-frequency device of a chip sized package shown in FIGS. 1 to 9. This module 100 is, for example, a wireless LAN card capable of processing both the low-frequency band and the high-frequency band, or a multimode wireless device capable of operating in a plurality of frequency bands.

Figure 15A:
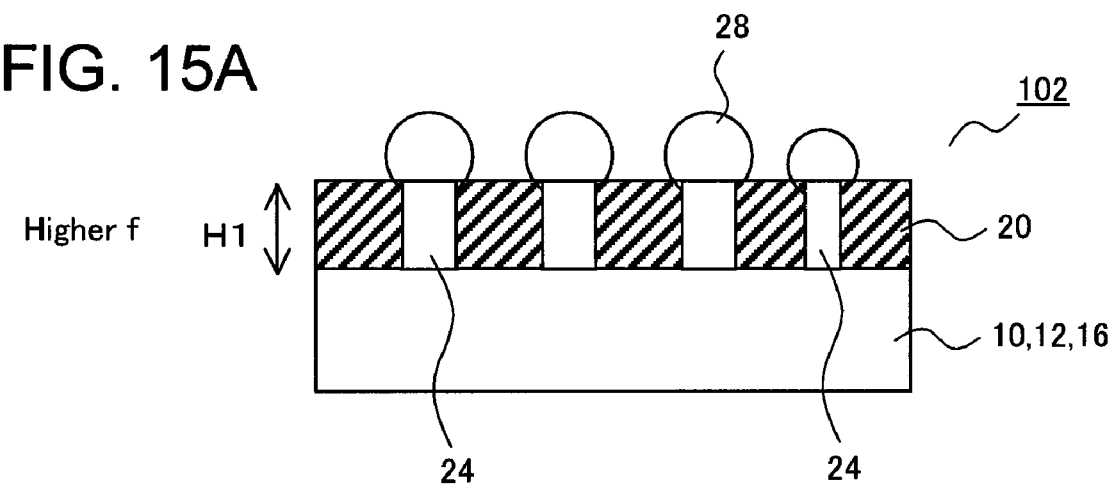
FIG. 15 is a cross-sectional view of high-frequency devices of two types.
Figure 15B:
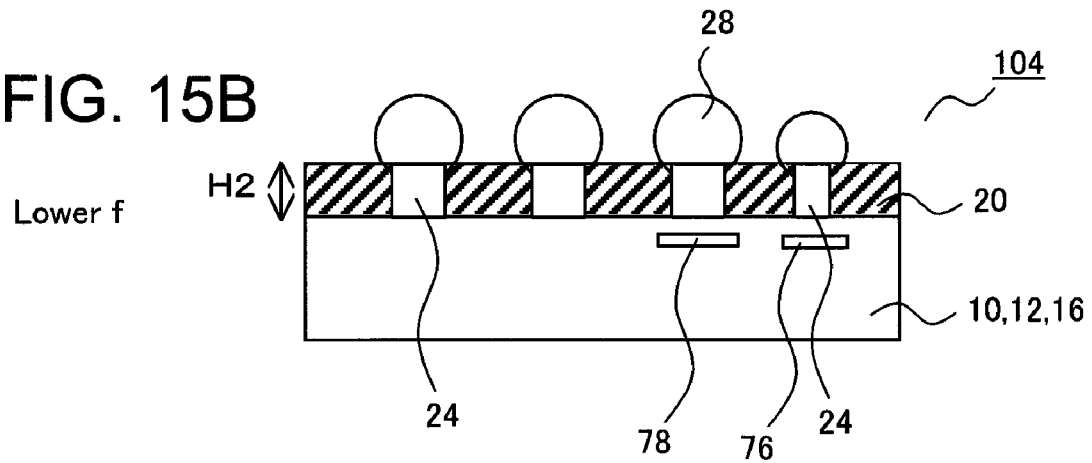

FIG. 15 is a cross-sectional view of the high-frequency devices of the two types. FIG. 15A is a cross-sectional view of the device 102 operating in a high-frequency band, and FIG. 15B is a cross-sectional view of the device 104 operating in a low-frequency band. As shown in the figures, in those devices 102, 104, electrically conductive posts 24 are formed inside a sealing resin layer 20, but in order to suppress coupling of the high-frequency circuit of the semiconductor substrate 10 with the high-frequency circuit of the mounting substrate, the height H1 of the electrically conductive posts 24 in the device operating in a high-frequency band is further increased, whereas the height H2 of the electrically conductive posts 24 in the device operating in the low-frequency band is further decreased. Because a small height of electrically conductive posts makes it possible to suppress the degradation of signal loss, it is preferred that the height be as small as possible. However, because strong coupling acts in a higher frequency region, it is preferred higher electrically conductive posts be formed for this region.

Further, in the device 102 operating in a high-frequency band, no ground shielding layer is provided below even the electrically conductive posts 24 transmitting a high-frequency signal. On the other hand, in the device 104 operating in a low-frequency band, ground shielding layers 76, 78 are provided under the electrically conductive posts 24 transmitting a high-frequency signal.

What is claimed is:

1. A high-frequency device comprising:
    a semiconductor substrate;
    a high-frequency circuit layer formed at a surface of said semiconductor substrate and including a circuit element and a multilayer wiring layer;
    a plurality of electrically conductive pads formed on said high-frequency circuit layer and connected to an input and an output of high-frequency circuit and to a power source;
    a plurality of rewiring layers formed on said high-frequency circuit layer via a first electrically insulating layer and respectively connected to said plurality of electrically conductive pads;
    an electrically insulating sealing layer which is formed on said first electrically insulating layer and said rewiring layer and has a thickness larger than that of said multilayer wiring layer;
    a plurality of mounting connection terminals which are provided on said electrically insulating sealing layer and correspond to said plurality of electrically conductive pads; and
    a plurality of electrically conductive posts provided inside said electrically insulating sealing layer and between said rewiring layer and mounting connection terminals,
    wherein the high-frequency circuit of said high-frequency circuit layer comprises an input amplifier for amplifying a high-frequency reception signal inputted from the electrically conductive post corresponding to said input and a power output amplifier for amplifying a high-frequency transmission signal and outputting the same from the electrically conductive post corresponding to said output; and
    wherein a first electrically conductive post corresponding to said power source has a first diameter;
    a second electrically conductive post corresponding to the input of said input amplifier has a second diameter which is less than said first diameter; and
    a third electrically conductive post corresponding to the output of said power output amplifier has a third diameter which is larger than said second diameter.

2. The high-frequency device according to claim 1, further comprising a first shielding layer provided over said high-frequency circuit layer, below said second or third electrically conductive post, and connected to a fixed potential.

3. The high-frequency device according to claim 2, further comprising a second shielding layer provided inside said multilayer wiring layer, below an electrically conductive pad connected to said second or third electrically conductive post, and connected to a fixed potential.

4. The high-frequency device according to claim 1, wherein
    said second or third electrically conductive post and an electrically conductive pad corresponding thereto are formed so as to be close to or overlap each other,
    said high-frequency device further comprising a first shielding layer provided inside said multilayer wiring layer, below said second or third electrically conductive post and an electrically conductive pad connected thereto, and connected to a fixed potential.

5. The high-frequency device according to claim 1, comprising a first post structure in which said second or third electrically conductive post and an electrically conductive pad corresponding thereto are separated by a prescribed distance from each other, and a second post structure in which said second or third electrically conductive post and an electrically conductive pad corresponding thereto are formed so as to be close to or overlap each other,
    wherein said first post structure comprises a first shielding layer provided over said high-frequency circuit layer, below said second or third electrically conductive post, and connected to a fixed potential, and a second shielding layer provided inside said multilayer wiring layer, below an electrically conductive pad connected to said second or third electrically conductive post, and connected to a fixed potential, and
    said second post structure comprises a third shielding layer provided inside said multilayer wiring layer, below said second or third electrically conductive post and an electrically conductive pad connected thereto, and connected to a fixed potential.

6. The high-frequency device according to claim 1, wherein a plurality of said first electrically conductive posts corresponding to the same power source are arranged with a high density, and said second or third electrically conductive posts are arranged with a density lower than that of said first electrically conductive posts.

7. A high-frequency device according to claim 1, further comprising a high-frequency device module comprising a first high-frequency device for processing a signal of a first high-frequency band and a second high-frequency device for processing a signal of a second high-frequency band which is higher than said first high-frequency band,
    wherein the height of the electrically conductive pads of the second high-frequency device is larger than the height of the electrically conductive pads of the first high-frequency device.

8. The high-frequency device according to claim 1, further comprising:
    a first shielding layer provided inside said multilayer wiring layer, below the electrically conductive pad connected to said second or third electrically conductive post, and connected to a fixed potential; and
    an inductor provided on said high-frequency circuit layer, between said rewiring layers, and having a spirally wound structure,
    wherein an impedance matching circuit of said input amplifier or power output amplifier is composed of said inductor and a capacitance between said electrically conductive pad and the first shielding layer.

9. The high-frequency device according to claim 1, further comprising:
    a first shielding layer provided on said high-frequency circuit layer, below said second or third electrically conductive post, and connected to a fixed potential; and
    an inductor provided on said high-frequency circuit layer, between said rewiring layers, and having a spirally wound structure,
    wherein an impedance matching circuit of said input amplifier or power output amplifier is composed of said inductor and a capacitance between said electrically conductive pad and the first shielding layer.

10. The high-frequency device according to claim 1, further comprising:
    a third shielding layer provided in said multilayer wiring layer, below said second or third electrically conductive post and an electrically conductive pad connected thereto, and connected to a fixed potential; and
    an inductor provided on said high-frequency circuit layer, between said rewiring layers, and having a spirally wound structure,
    wherein an impedance matching circuit of said input amplifier or power output amplifier is composed of said inductor and a capacitance between said electrically conductive pad and the third shielding layer.

11. A high-frequency device module comprising first and second high-frequency devices each comprising:
    a semiconductor substrate;
    a high-frequency circuit layer formed at a surface of said semiconductor substrate and including a circuit element and a multilayer wiring layer;
    a plurality of electrically conductive pads formed on said high-frequency circuit layer and connected to an input and an output of high-frequency circuit and to a power source;
    a plurality of rewiring layers formed on said high-frequency circuit layer via a first electrically insulating layer and respectively connected to said plurality of electrically conductive pads;
    an electrically insulating sealing layer which is formed on said first electrically insulating layer and said rewiring layer and has a thickness larger than that of said multilayer wiring layer;
    a plurality of mounting connection terminals which are provided on said electrically insulating sealing layer and correspond to said plurality of electrically conductive pads; and
    a plurality of electrically conductive posts provided inside said electrically insulating sealing layer and between said rewiring layer and mounting connection terminals,
    wherein said first high-frequency device comprises a first high-frequency circuit for processing a signal of a first high-frequency band, and said second high-frequency device comprises a second high-frequency circuit for processing a signal of a second high-frequency band which is higher than said first high-frequency band; and
    the height of the electrically conductive posts of the second high-frequency device is larger than the height of the electrically conductive posts of the first high-frequency device.

12. The high-frequency device module according to claim 11,
    wherein said first and second high-frequency circuits each comprise an input amplifier for amplifying a high-frequency reception signal inputted from the electrically conductive post corresponding to said input and a power output amplifier for amplifying a high-frequency transmission signal and outputting the same from the electrically conductive post corresponding to said output; and
    wherein a first electrically conductive post corresponding to said power source has a first diameter;
    a second electrically conductive post corresponding to the input of said input amplifier has a second diameter which is less than said first diameter; and
    a third electrically conductive post corresponding to the output of said power output amplifier has a third diameter which is larger than said second diameter.

\* \* \* \* \*